(12) United States Patent
Seo et al.

(10) Patent No.: US 6,239,022 B1
(45) Date of Patent: May 29, 2001

(54) METHOD OF FABRICATING A CONTACT IN A SEMICONDUCTOR DEVICE

(75) Inventors: Jun Seo, Suwon; Woo-Sik Kim, Seoul; Jong-Heui Song, Suwon; Young-Woo Park, Gunpo, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/604,708

(22) Filed: Jun. 27, 2000

(30) Foreign Application Priority Data

Jun. 29, 1999 (KR) .................................. 99-25342

(51) Int. Cl.⁷ ............................................. H01L 21/4763
(52) U.S. Cl. .................... 438/629; 438/647; 438/672; 438/719
(58) Field of Search ..................... 438/622, 629, 438/647, 672, 706, 719

(56) References Cited

U.S. PATENT DOCUMENTS

| | | | |
|---|---|---|---|
| 4,214,946 | * 7/1980 | Forget et al. | 156/643 |
| 5,641,991 | * 6/1997 | Sakoh | 257/755 |
| 5,726,085 | 3/1998 | Crenshaw et al. | 255/438 |
| 5,728,619 | * 3/1998 | Tsai et al. | 438/297 |
| 5,793,077 | * 8/1998 | Tseng | 257/301 |
| 6,008,514 | * 12/1999 | Wu | 257/308 |

FOREIGN PATENT DOCUMENTS 11-17143 * 1/1999 (JP) .

* cited by examiner

Primary Examiner—T. N. Quach
(74) Attorney, Agent, or Firm—Marger Johnson & McCollom, P.C.

(57) ABSTRACT

A method for forming a contact plug formed of polysilicon and a method for manufacturing a semiconductor device using the same are provided. The contact plug is formed by etching back polysilicon which fills a contact hole and is deposited on an interlayer dielectric film using a gas mixture of $SF_6$, $CHF_3$, and $CF_4$, thus planarizing the polysilicon. Also, the contact plug can be made protrude above the interlayer dielectric film by etching the entire surface of the exposed interlayer dielectric film around the polysilicon contact plug formed by etching back the polysilicon. According to the present invention, the degree of planarization of the polysilicon contact plug is improved by etching back the polysilicon using the gas mixture of $SF_6$, $CHF_3$, and $CF_4$. Furthermore, it is possible to prevent contact failure due to the depression of the contact plug by etching the entire surface of the interlayer dielectric film thus causing the contact plug to protrude above the interlayer dielectric film, thereby increasing the plug's contact area and reducing the contact failure.

21 Claims, 7 Drawing Sheets

METHOD OF FABRICATING A CONTACT IN A SEMICONDUCTOR DEVICE

BACKGROUND OF THE INVENTION

1. Field of the Invention

The present invention relates to a method of manufacturing a semiconductor device, and more particularly, to a multi-level interconnect technology.

2. Description of the Related Art

In general, a contact for electrically connecting upper and lower conductive layers is formed as follows in a semiconductor device. After an interlayer dielectric film is formed on the lower conductive layer, a contact hole to expose the lower conductive layer is formed by etching the interlayer dielectric film in which the contact is to be made. The upper conductive layer is formed by depositing a conductive material in the contact hole and on the interlayer dielectric film so as to fill the contact hole, and patterning the conductive material on the interlayer dielectric film to have a desired shape. When the aspect ratio of the contact hole is large or a material for filling the contact hole is different from the material of which the upper conductive layer is formed, the patterned conductive material is not used as the upper conductive layer. In other words, the conductive material deposited on the interlayer dielectric film is removed and the conductive material is left only inside the contact hole. What fills the contact hole is called a contact plug. In the present invention, the contact plug is formed of polysilicon, which is widely used for semiconductor devices.

When the contact plug is formed of polysilicon, the conductive material deposited on the interlayer dielectric film must be removed. Typically, the conductive material is removed by a chemical mechanical polishing (CMP) method and an etch-back method. The CMP method is, however, costly and its process stability has not been sufficiently secured yet. Thus the CMP method often causes several problems for the mass production of semiconductor devices. Also, in the CMP method, thickness uniformity deteriorates since the abrasion rate varies depending on the surface area of the wafer. On the other hand, the etch back method is less costly. However, thickness uniformity also deteriorates since the etch rate varies depending on the size of the contact hole.

In particular, referring to FIG. 1 showing a polysilicon contact plug formed using the conventional etch-back method, an interlayer dielectric film 13, which is typically formed of a silicon oxide layer, with a contact hole opened therein, is formed on a lower conductive layer 11 on a substrate. A polysilicon contact plug 15 is formed inside the contact hole. As shown in FIG. 1, the contact plug 15 is slightly recessed, and thus it is not flush with the interlayer dielectric film 13. This is because the polysilicon filling the contact hole is etched and recessed during over-etching of polysilicon using a gas mixture obtained by mixing HBr or He with $Cl_2$ or $SF_6$ so that the polysilicon is not left on the interlayer dielectric film 13. The degree of the recession of the contact plug 15 is larger when the uniformity of the etch rate deteriorates due to the large-size contact hole.

The recessed polysilicon contact plug 15, shown in FIG. 1, can cause various problems in subsequent processing steps. In particular, one such problem is observed especially when there is a pattern misalignment as illustrated in FIG. 2. In detail, an etch stop layer 17 is formed on the contact plug 15 and the interlayer dielectric film 13 as shown in FIG. 1. The etch stop layer 17 is usually formed of a silicon nitride layer when the interlayer dielectric film 13 is a silicon oxide layer and has a high etch selectivity with respect to the interlayer dielectric film 13. Next, A second interlayer dielectric film 19 is formed on the etch stop layer 17. Then a second contact hole 20 exposing the contact plug 15 is formed in the second interlayer dielectric film 19. If there is a misalignment between the second contact hole 20 and the underlying plug 15 as shown in FIG. 2, a spacer A of the silicon nitride layer 17 can be formed at the edge of the interlayer dielectric film 13. Accordingly, the contact resistance of the completed contact increases or, in worst case, the contact plug 15 does not get completely exposed. Therefore, contact failure can occur.

Also, when the contact plug 15 is recessed, the degree of planarization of the second dielectric layer 19 overlying the contact plug 15 gets worse. Therefore, it is difficult to accurately pattern the dielectric layer overlying the contact plug 15.

SUMMARY OF THE INVENTION

To solve the above problem, it is an object of the present invention to provide a method of forming a polysilicon contact plug with a high degree of planarization.

It is another object of the present invention to provide a method of manufacturing a semiconductor device using the above method.

Accordingly, to achieve the first object, there is provided a method for forming a contact plug of a semiconductor device. In the method for forming the contact plug of the semiconductor device, a silicon oxide layer is deposited on a lower conductive layer. A contact hole for exposing a portion of the lower conductive layer at which a contact is to be made is formed by etching the silicon oxide layer. A polysilicon layer is formed in the contact hole and on the silicon oxide layer so as to completely fill the contact hole. The silicon oxide layer is exposed and a polysilicon contact plug is formed by etching back the polysilicon layer deposited on the silicon oxide layer using a gas mixture of $SF_6$, $CHF_3$, and $CF_4$.

Namely, in the present invention, it is possible to prevent the polysilicon contact plug from being recessed by etching back the polysilicon layer using the gas mixture including $SF_6$, $CHF_3$, and $CF_4$.

According to an embodiment of the present invention, in the method for forming the contact plug of the semiconductor device, an interlayer dielectric film is deposited on a lower conductive layer. A contact hole for exposing a portion of the lower conductive layer at which a contact is to be made is formed by etching the interlayer dielectric film. A polysilicon layer is deposited in the contact hole and on the interlayer dielectric film so as to completely fill the contact hole. The interlayer dielectric film is exposed and a polysilicon contact plug is formed by etching back the polysilicon layer. The contact plug protrudes above the surface of the interlayer dielectric film by etching the entire surface of the exposed interlayer dielectric film so as to partially remove the interlayer dielectric film.

Namely, it is possible to prevent the polysilicon contact plug from being recessed by removing the interlayer dielectric film by a predetermined thickness after forming the contact plug.

To achieve the second object, there is provided a method for manufacturing a semiconductor device. In the method for manufacturing the semiconductor device, an interlayer dielectric film is deposited on a semiconductor substrate on which a transistor, a pad for a lower electrode contact, and a bit line are formed. A lower electrode contact hole for exposing the pad for the lower electrode contact is formed by etching the interlayer dielectric film. A polysilicon layer is deposited in the lower electrode contact hole and on the interlayer dielectric film so as to completely fill the lower electrode contact hole. The interlayer dielectric film is exposed by etching back the polysilicon layer so as to form a lower electrode contact plug of polysilicon. The lower electrode contact plug protrudes above the surface of the interlayer dielectric film by etching the entire surface of the exposed interlayer dielectric film so as to partially remove the top portion of the interlayer dielectric film. A lower electrode, a dielectric film, and an upper electrode are formed on the lower electrode contact plug.

According to the present invention, the polysilicon contact plug is prevented from being undesirably recessed, thereby obtaining a polysilicon contact plug with good planarity by a simple process. The process is performed by etching back the polysilicon layer using a gas mixture including $SF_6$, $CHF_3$, and $CF_4$ or by partially removing the top surfaces of the interlayer dielectric film so that the contact plug protrudes above the interlayer dielectric film.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Hereinafter, preferred embodiments of the present invention will be described in detail with reference to the attached drawings.

Method for Forming Polysilicon Contact Plug

First Embodiment

Figure 3:
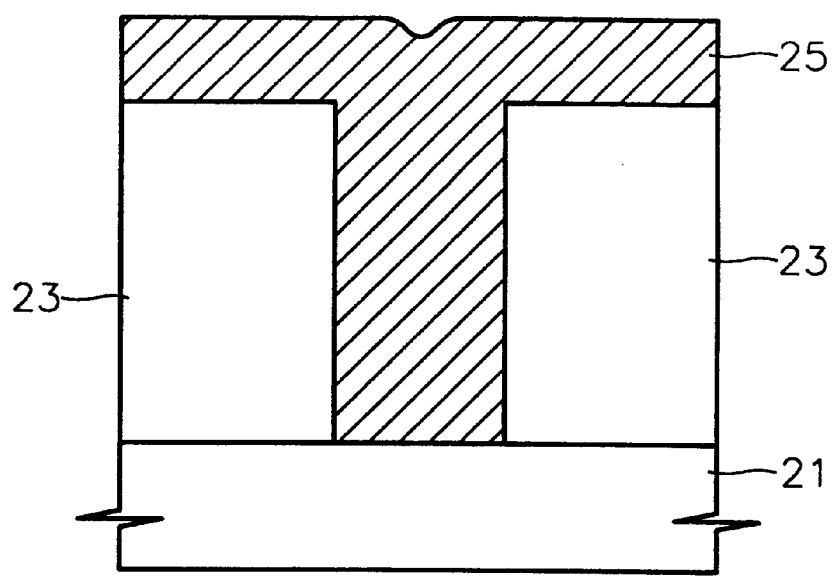
FIGS. 3 and 4 are sectional views showing processes of forming the contact plug by polysilicon according to an embodiment of the present invention.
Figure 4:
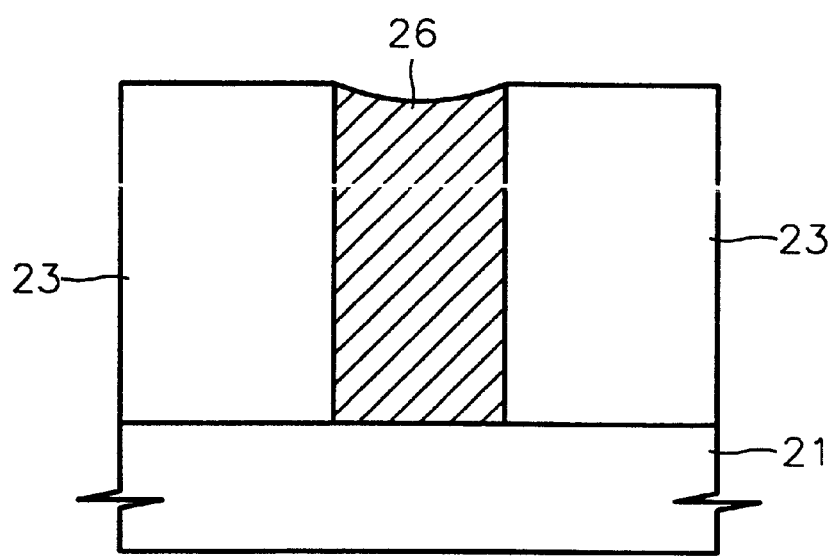

FIGS. 3 and 4 are sectional views showing processes of forming a contact plug formed of polysilicon according to the first embodiment of the present invention.

As shown in FIG. 3, an interlayer dielectric film 23 formed of a silicon oxide layer is formed on a lower conductive layer 21 and a contact hole which exposes the lower conductive layer 21 is formed by selectively etching the interlayer dielectric film 23 where contact is to be made. The lower conductive layer 21 may be a source or drain region of a transistor or a conductive layer pattern for wiring. The contact hole is filled by depositing a conductive material layer such as polysilicon layer 25 in the contact hole and on the interlayer dielectric film 23.

As shown in FIG. 4, a contact plug 26 is formed by removing and planarizing the polysilicon layer 25 deposited on the interlayer dielectric film 23. The planarizing process is preferably performed by etching back the polysilicon layer 25 until the interlayer dielectric film 23 is exposed using a gas mixture of $SF_6$, $CHF_3$, and $CF_4$ by a magnetically enhanced reactive ion etching (MERIE) method in the first embodiment. In the gas mixture of $SF_6$, $CHF_3$, and $CF_4$, as an etching gas, $SF_6$ determines the etch rate of the polysilicon layer 25. As the flow rate of $SF_6$ gas increases, the etch rate of polysilicon layer 25 increases and the polysilicon contact plug 26 is remarkably recessed as the flow rate of $SF_6$ increases. For example, when the flow rates of $SF_6$ are 10, 15, and 20 standard cubic centimeter per minute (sccm), the corresponding etch rates are approximately 1100, 1300, and 1600 Å/min, respectively. In the gas mixture of $SF_6$, $CHF_3$, and $CF_4$, $CHF_3$ gas and $CF_4$ gas do not affect the etch rate of polysilicon layer 25 and increase the etch rate of the silicon oxide interlayer dielectric film 23. As a result, a planarized polysilicon contact plug that is only slightly recessed is obtained, as shown in FIG. 4. Preferable flow rates of $SF_6$ gas, $CHF_3$ gas, and $CF_4$ gas where an etch profile is easily controlled are 5 through 20, 10 through 40, and 10 through 40 sccm, respectively.

Other alternative process conditions for the MERIE method of the present invention are as follows. Namely, pressure, substrate temperature, RF power, and magnetic field are set to be 3 through 200 mTorr, 0 through 60° C., 150 through 600 W, and 0 (the magnetic field is not applied) through 60 G, respectively. Using these various process conditions, it has been observed that etch uniformity is improved as the pressure is reduced. The deviation of only about 2% was shown under a pressure of 20 mTorr. The etch uniformity was the best when a magnetic field of 30 G is used. Influences of the RF power and temperature are negligible.

According to the present invention in which polysilicon layer 25 and the silicon oxide layer 23 are etched back using the gas mixture of $SF_6$, $CHF_3$, and $CF_4$, the degree of planarization is improved much more than that of a conventional case where polysilicon is etched by $SF_6$, $Cl_2$, or a gas mixture obtained by mixing He or HBr with $SF_6$ or $Cl_2$.

In this embodiment, the MERIE method is used. However, other dry etching methods, such as plasma etching or enhanced reactive ion etching, can be also used to implement the present invention using the above described etching gas.

Second Embodiment

Figure 1:
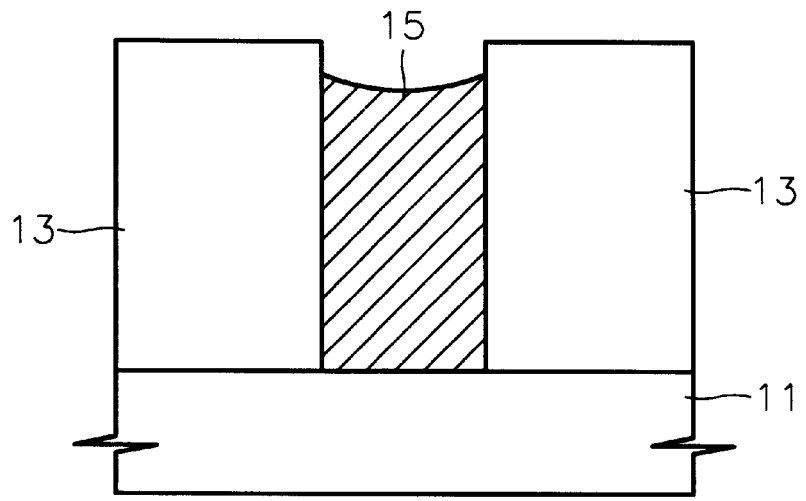
FIG. 1 is a sectional view showing a conventional case where a contact plug is formed of polysilicon.
Figure 2:
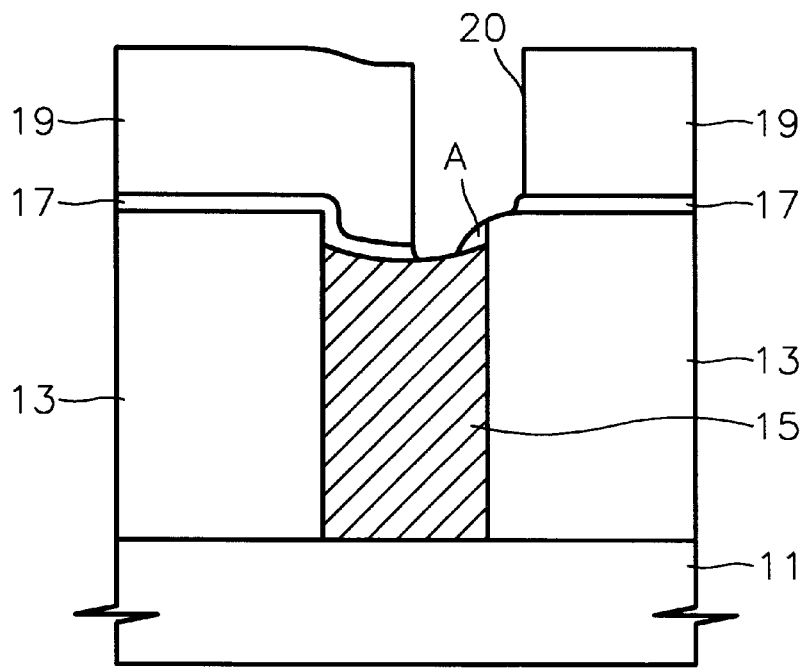
FIG. 2 is a sectional view showing problems which occur when a contact is formed on the contact plug having the structure as shown in FIG. 1.
Figure 5A:
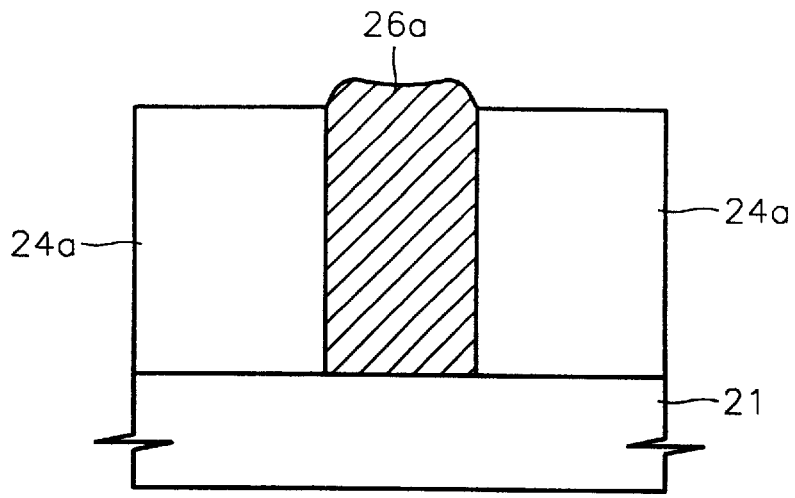
FIGS. 5A through 5C are sectional views showing processes of forming the contact plug of polysilicon according to another embodiment of the present invention.
Figure 5B:
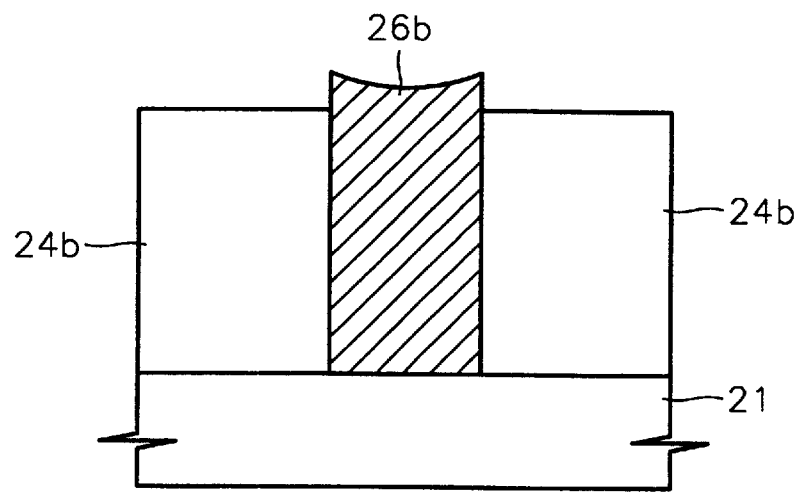
Figure 5C:
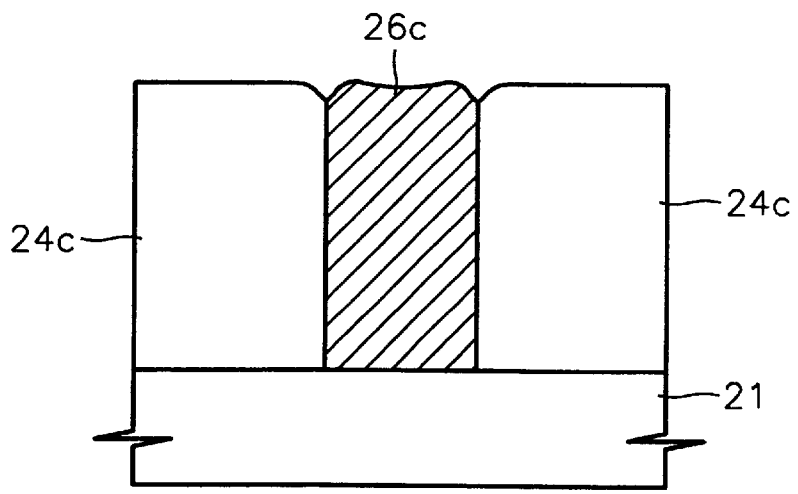

FIGS. 5A through 5C are sectional views showing a method of forming a polysilicon contact plug according to the second embodiment of the present invention. In this embodiment, after forming a polysilicon contact plug in an interlayer dielectric film, the top exposed portions of the interlayer dielectric film are partially removed to a predetermined thickness so that the polysilicon contact plug protrudes slightly above the interlayer dielectric film. This embodiment improves an etch back method where the etch rate of the polysilicon contact plug can vary depending on the area of a contact hole, therefore undesirably recessing the contact plug. In contrast, when the contact plug slightly protrudes above the interlayer dielectric film, an area where the contact plug contacts an upper conductive layer increases. The undesirable nitride layer spacer A that prevents a contact plug 15 from being exposed (See FIG. 2) does not occur. Therefore, the probability of contact failure is reduced by the present invention.

The detailed explanation for the second embodiment follows. First, an interlayer dielectric film is formed on a lower conductive layer and the dielectric film is subsequently etched, thereby forming a contact hole as in the first embodiment. A polysilicon contact plug is formed by filling the contact hole with a polysilicon layer and etching back the polysilicon layer. The second embodiment can be performed in-situ after the process steps of the first embodiment (refer to FIG. 4). However, the second embodiment is not necessarily performed sequentially after the process steps of the first embodiment. In other words, the polysilicon layer is not necessarily etched back using a gas mixture of $SF_6$, $CHF_3$, and $CF_4$ as in the first embodiment. Alternatively, the polysilicon layer may be etched back using a conventional etching gas. Also, the interlayer dielectric film can be formed by a dielectric layer other than the silicon oxide layer as in the first embodiment.

The polysilicon contact plug 26 is made to protrude above the interlayer dielectric film by etching the entire surface of the interlayer dielectric film 23 by a predetermined thickness. In detail, the entire surface of the interlayer dielectric film 23 is dry or wet-etched using an appropriate etching gas or an etching solution depending on the material comprising the interlayer dielectric film 23. In the second embodiment, preferably, the interlayer dielectric film 23 is a silicon oxide layer.

In the second embodiment, the silicon oxide layer is etched preferably using $CHF_3$ gas, $CF_4$ gas or a gas mixture of $CHF_3$ and $CF_4$. When only $CHF_3$ gas is used, only the interlayer dielectric film 24b is etched as shown in FIG. 5B and thus the polysilicon contact plug 26b protrudes above the interlayer dielectric film. However, the edge of the contact plug 26b still remains. Accordingly, the degree of planarization of the interlayer dielectric film 24b and the contact plug 26b deteriorates slightly while still producing a structure that is superior to the prior art.

When only $CF_4$ gas is used, as shown in FIG. 5C, the edge of the interlayer dielectric film 24c is partially etched together with the edge of the contact plug. As a result, grooves are formed at the boundary between the contact plug 26c and the interlayer dielectric film 24c. Accordingly, the degree of planarization of the polysilicon contact plug deteriorates somewhat while still producing a structure that is superior to the prior art.

When the gas mixture of $CHF_3$ and $CF_4$ is used, as shown in FIG. 5A, the edge of the contact plug formed of polysilicon is etched together with the entire surface of the interlayer dielectric film formed of silicon oxide. Accordingly, the degree of planarization is improved. The contact plug 26a protrudes above the interlayer dielectric film 24a. Therefore, dry etching using the gas mixture of $CHF_3$ and $CF_4$ is most preferred.

In the second embodiment, the MERIE equipment is preferably used for performing dry etching on the interlayer dielectric film as in the first embodiment. According to the results of the experiments performed under the same process conditions, the profiles of the contact plug and the interlayer dielectric film are most desirable when the pressure is lowest and the magnetic field is approximately 30 G. Also, the profiles of the contact plug and the interlayer dielectric film are most desirable when the flow rates of $CHF_3$ and $CF_4$ are 5 through 100 and 5 through 50 sccm, respectively, and the ratio between $CHF_3$ and $CF_4$ is 2:1 in the gas mixture of $CHF_3$ and $CF_4$.

Alternatively, the interlayer dielectric film can be wet etched using a solution mixture of $NH_4F$ and HF so as to obtain the profiles of the contact plug and the interlayer dielectric film of FIG. 5A.

Consequently, in accordance with the second embodiment, a contact plug of a desirable shape protruding above the interlayer dielectric film can be obtained by controlling the profiles of the contact plug and the interlayer dielectric film with additional etching of the entire surface of the interlayer dielectric film.

Method of Manufacturing Semiconductor Device Having Polysilicon Contact Plug

Third Embodiment

FIGS. 6 through 12 are cross-sectional views showing processes of manufacturing a semiconductor device using the method of forming the polysilicon contact plug of the above embodiments. Among semiconductor devices, a memory device, in particular, a DRAM device wherein a unit cell consists of a transistor and a capacitor is provided in the present embodiment. However, the method of forming the polysilicon contact plug according to the present invention can be applied to any other semiconductor devices that require contacts for interconnecting conductive layers.

Figure 6:
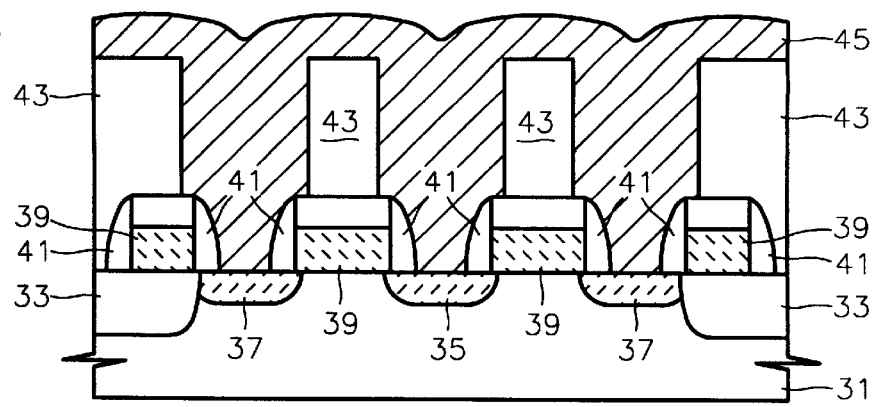
FIGS. 6 through 12 are sectional views showing processes of manufacturing a semiconductor memory device using a method of forming the polysilicon contact plug according to the present invention.

As shown in FIG. 6, after forming gate electrodes 39 having side wall spacers 41 on a semiconductor substrate 31 with source/drain regions 37, 35 and isolation layers 33 formed thereon, contact holes are formed by depositing and etching a first interlayer dielectric film 43 formed of a silicon oxide layer to expose the source and drain regions 37 and 35. A polysilicon layer 45 is then deposited on the entire surface of the semiconductor substrate 31 so as to fill the contact holes.

Figure 7:
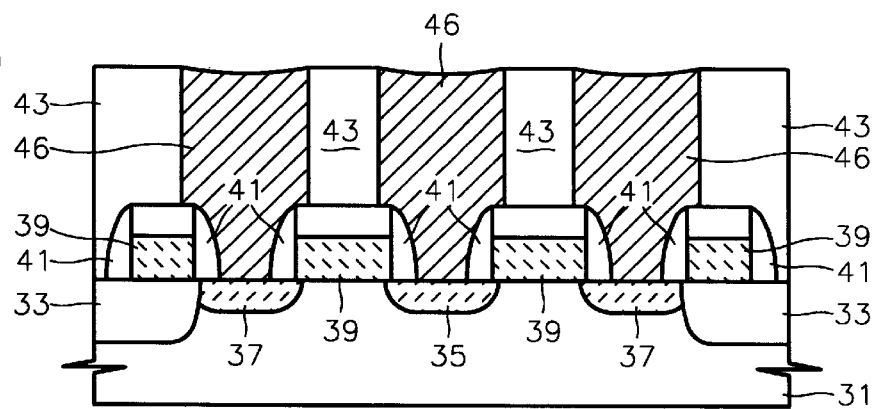

The first interlayer dielectric film 43 is exposed and a contact plug 46 is formed as shown in FIG. 7 by etching back the polysilicon layer 45. The contact plug 46 formed on the drain region 35 is for a bit line. The contact plug 46 formed on the source region 37 becomes a pad for a lower electrode contact. Here, the contact plug for the bit line and the pad for the lower electrode contact do not have to be formed on the same plane. However, the contact plug and the pad are shown to be formed on the same plane for simplicity as shown in FIG. 7.

In one aspect of the present invention, the polysilicon layer 45 is etched back using a gas mixture of $SF_6$, $CHF_3$, and $CF_4$ as in the first embodiment. Alternatively, the contact plug 46 may be made to protrude above the interlayer dielectric film by etching the entire surface of the first interlayer dielectric film 43 as in the second embodiment after etching back the polysilicon layer 45.

Figure 8:
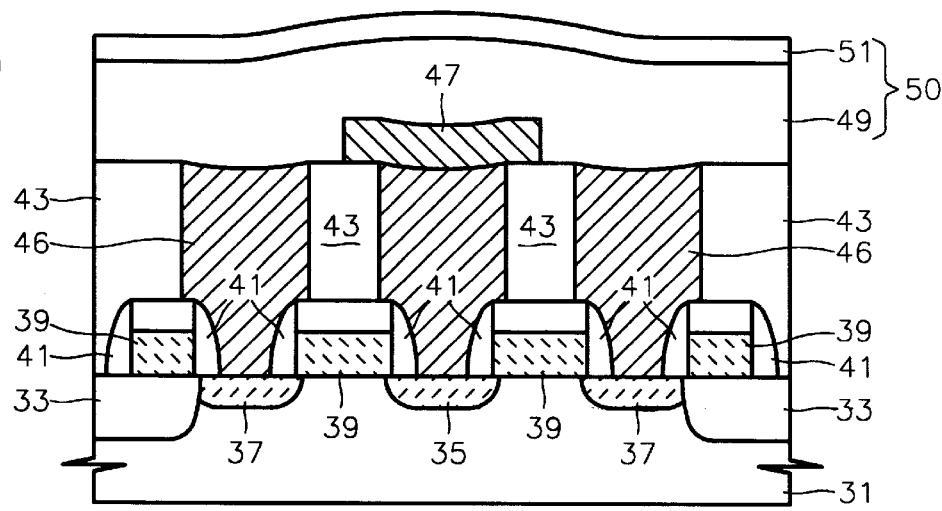

As shown in FIG. 8, a bit line 47 is formed by depositing a conductive material layer such as a single layer of polysilicon or a stacked layer of a polysilicon layer and a metal silicide layer, and subsequently etching the conductive material layer. A second interlayer dielectric film 50 is formed on the entire surface of the resulting structure. The second interlayer dielectric film 50 can be formed of a single layer of silicon oxide. However, in the present invention, the second interlayer dielectric film 50 is formed of a double layer structure composed of a boron phosphorus silicate glass (BPSG) layer 49 with excellent flowability and a dense high temperature oxide layer 51 as a capping layer.

Figure 9:
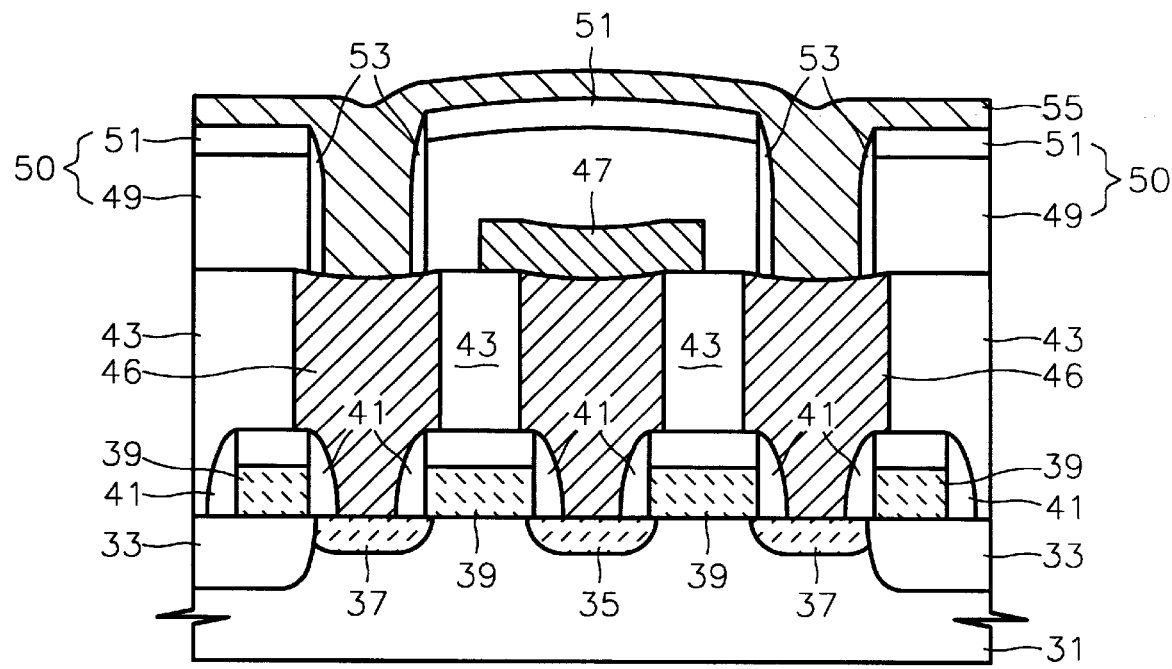

As shown in FIG. 9, contact holes are formed by etching the second interlayer dielectric film 50 in order to form a contact connected to the lower electrode. The polysilicon layer 55 is deposited on the entire surface of the substrate in order to fill the contact holes. Here, the polysilicon layer 55 may be deposited on the entire surface of the substrate after forming side wall spacers 53 of a silicon nitride layer on the second interlayer dielectric film to prevent the second interlayer dielectric film, for example, the BPSG layer 49 from being etched in the following etching processes.

Figure 10:
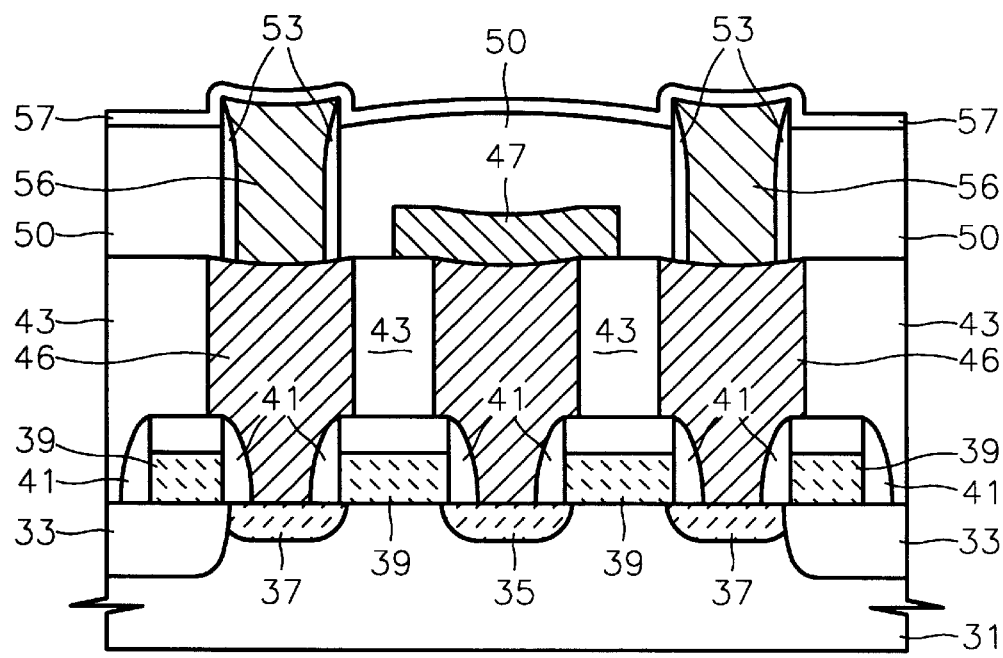

As shown in FIG. 10, a lower electrode contact plug 56 is formed by etching back the polysilicon layer 55 and etching the entire surface of the second interlayer dielectric film 50 by the method of the first or second embodiment. A silicon nitride layer 57 which is an etch stop layer is formed on the entire surface of the substrate.

Figure 11:
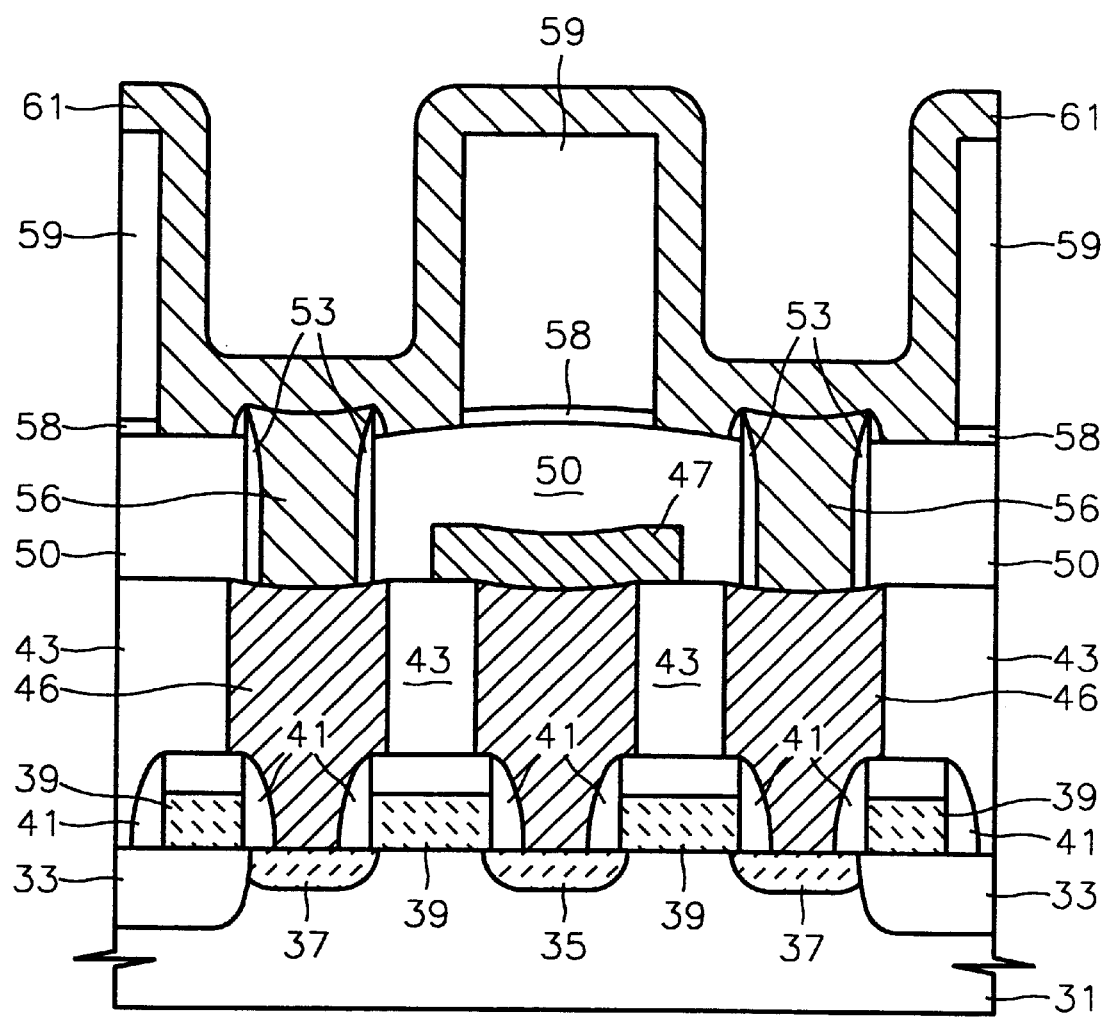

As shown in FIG. 11, an opening is formed exposing the lower electrode contact plug 56 in a region in which the lower electrode is desired by depositing a third interlayer dielectric film 59 on the entire surface of the substrate and etching the third interlayer dielectric film 59. Here, the third interlayer dielectric film 59 is etched until the etching stop layer 57 is exposed and the etching stop layer 57 is then etched. Thus an opening is formed exposing the second interlayer dielectric film 50 and the lower electrode contact plug 56. Then, a conductive layer 61 to form a lower electrode is deposited on the entire surface to a predetermined thickness.

Figure 12:
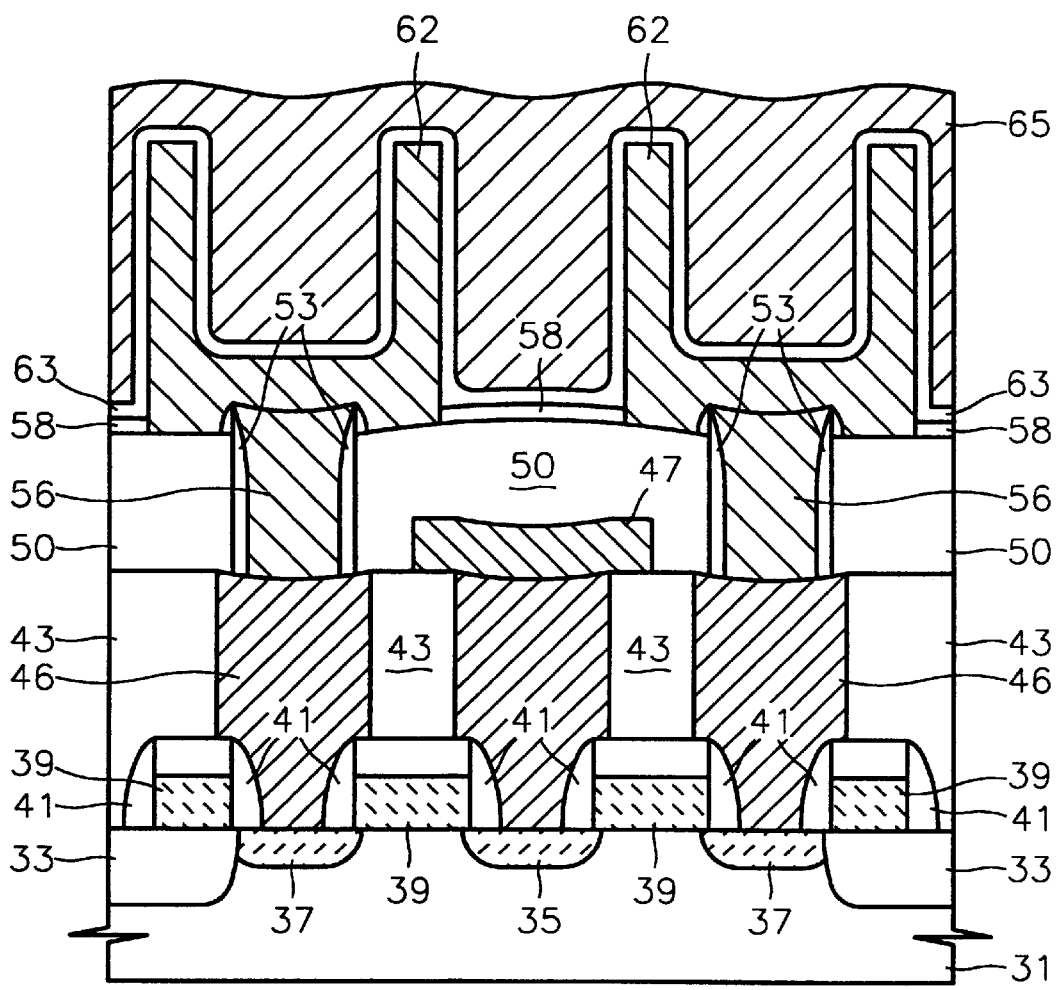

As shown in FIG. 12, a semiconductor device is completed by patterning the conductive layer 61 to form a lower electrode 62 and sequentially depositing a dielectric layer 63 and an upper electrode 65 on the patterned lower electrode 62. Here, the lower electrode 62 is preferably of a cylindrical shape. However, the lower electrode 62 may be in the form of a stack or a fin. Also, hemispherical grains may be formed on the surface of the lower electrode 62.

According to the present embodiment, the probability of contact failure is reduced by making the lower electrode contact plug protrude above the interlayer dielectric film.

In the above-mentioned present embodiment, the spacers 41 are formed on the side walls of the gate electrodes. Contacts are formed by a self-align contact (SAC) method. However, when the degree of integration is low or alignment tolerance is large, the SAC method may not be required. Also, the contact for the capacitor lower electrode 62 is formed of the pad 46 and the contact plug 56. However, when the step difference is not large, the contact can be formed of a single contact plug by etching the second interlayer dielectric film 50 (see FIG. 8) and the first interlayer dielectric film 43 without forming the pad 46.

As mentioned above, according to the present invention, the planarity of a polysilicon contact plug is improved by etching back a polysilicon layer using the gas mixture of $SF_6$, $CHF_3$, and $CF_4$. Also, the possibility of contact failure can be reduced by etching the entire surface of an interlayer dielectric film in which the contact plug is formed, thereby making the contact plug protrude above the interlayer dielectric film. This increases the contact area and prevents the formation of unwanted spacers at the edge of the interlayer dielectric film and on the contact plug, thereby preventing the contact failure.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for forming a contact plug of a semiconductor device, comprising:
   (a) forming a silicon oxide layer over a lower conductive layer;
   (b) selectively etching the silicon oxide layer, thereby forming a contact hole in the silicon oxide layer to expose a portion of the lower conductive layer;
   (c) forming a polysilicon layer in the contact hole and on the silicon oxide layer, thereby filling the contact hole; and
   (d) etching back the polysilicon layer using a gas mixture including $SF_6$, $CHF_3$, and $CF_4$ until the silicon oxide layer is exposed, thereby forming a contact plug.

2. The method of claim 1, wherein the flow rates of $SF_6$, $CHF_3$, and $CF_4$ are approximately 5 through 20 standard cubic centimeter per minute (sccm), approximately 10 through 40 sccm, and approximately 10 through 40 sccm, respectively, in the step (d).

3. The method of claim 1, after the step (d), further comprising the step (e1) of etching back and partially removing the silicon oxide layer using a gas mixture including $CHF_3$ and $CF_4$.

4. The method of claim 3, wherein the steps (d) and (e1) are performed in-situ.

5. The method of claim 3, wherein the flow rates of $CHF_3$ and $CF_4$ are approximately 5 through 100 sccm and 5 through 50 sccm, respectively, in the step (e1).

6. The method of claim 3, wherein a volume ratio between $CHF_3$ and $CF_4$ is approximately 2:1.

7. The method of claim 1, further comprising the step (e2) of partially removing the silicon oxide layer by wet etching the silicon oxide layer using a solution mixture including $NH_4F$ and HF.

8. The method of claim 1, wherein said etching back comprises magnetically enhanced reactive ion etching (MERIE).

9. The method of claim 8, wherein a magnetic field of approximately 30 G is applied for MERIE.

10. A method for forming a contact plug of a semiconductor device, comprising:
    (a) forming an interlayer dielectric film on a lower conductive layer;
    (b) selectively etching the interlayer dielectric film, thereby forming a contact hole in the interlayer dielectric film to expose a portion of the lower conductive layer;
    (c) forming a polysilicon layer in the contact hole and on the interlayer dielectric film so as to fill the contact hole;
    (d) etching back the polysilicon layer until the interlayer dielectric film is exposed, using a gas mixture including $SF_8$, CHF3 and CH4, thereby forming a polysilicon contact plug; and
    (e) etching the entire surface of the exposed interlayer dielectric film so as to partially remove the interlayer dielectric film to a predetermined thickness, thereby protruding the top portion of the contact plug above the surface of the interlayer dielectric film.

11. The method of claim 10, wherein, the interlayer dielectric film is formed of silicon oxide, and the entire surface of the interlayer dielectric film is etched back using $CHF_3$, $CF_4$, or a gas mixture including $CHF_3$ and $CF_4$, in the step (e).

12. The method of claim 10, wherein the steps (d) and (e) are performed in-situ.

13. The method of claim 10, wherein the edge of the contact plug is etched concurrently with the entire surface of the interlayer dielectric film in the step (e).

14. The method of claim 10, wherein, the interlayer dielectric film is formed of silicon oxide, and the entire surface of the exposed interlayer dielectric film is etched back using a solution mixture including $NH_4F$ and HF, in the step (e).

15. A method for manufacturing a semiconductor device, comprising:
   (a) forming an interlayer dielectric film on a semiconductor substrate with a transistor and a contact pad formed thereon;
   (b) selectively removing the interlayer dielectric film, thereby forming a contact hole to expose a portion of the contact pad;
   (c) forming a polysilicon layer in the contact hole and on the interlayer dielectric film so as to fill the contact hole;
   (d) etching back the polysilicon layer until the interlayer dielectric film is exposed, to form a contact plug;
   (e) etching the entire surface of the exposed interlayer dielectric film and partially removing the interlayer dielectric film to a predetermined thickness, thereby protruding the top portion of the contact plug above the surface of the interlayer dielectric film; and
   (f) sequentially forming a lower electrode, a dielectric film, and an upper electrode on the contact plug.

16. The method of claim 15, wherein, in the step (d), the polysilicon layer is etched back using a gas mixture including $SF_6$, $CHF_3$, and $CF_4$.

17. The method of claim 15, wherein the interlayer dielectric film is formed of silicon oxide, and the interlayer dielectric film is etched back using a gas mixture including $CHF_3$ and $CF_4$, in the step (e).

18. The method of claim 15, wherein the interlayer dielectric film is formed of silicon oxide, and the interlayer dielectric film is etched back using a solution mixture including $NH_4F$ and HF, in the step (e).

19. The method of claim 15, wherein the contact pad protrudes above the surface of an interlayer dielectric film surrounding the contact pad.

20. The method of claim 15, wherein the interlayer dielectric film is a double layer structure composed of a borophosphosilicate glass (BPSG) layer and a high temperature oxide layer.

21. The method of claim 20, further comprising the step of forming side wall spacers formed of silicon nitride on the side walls of the contact hole, between the steps (b) and (c).

* * * * *

UNITED STATES PATENT AND TRADEMARK OFFICE
CERTIFICATE OF CORRECTION

PATENT NO.    : 6,239,022 B1
DATED         : May 29, 2001
INVENTOR(S)   : Seo et al.

It is certified that error appears in the above-identified patent and that said Letters Patent is hereby corrected as shown below:

<u>Title page,</u>
Item [57], ABSTRACT,
Line 7, "made protrude" should read -- made to protrude --.

<u>Column 2,</u>
Line 2, "Next, A second" should read -- Next, a second --.

<u>Column 8,</u>
Line 49, "CHF3 and CH4" should read -- CHF3 and CH4--.

Signed and Sealed this

Fifth Day of November, 2002

*Attest:*

*Attesting Officer*

JAMES E. ROGAN
*Director of the United States Patent and Trademark Office*